United States Patent
Huang et al.

(10) Patent No.: US 8,514,005 B2
(45) Date of Patent: Aug. 20, 2013

(54) CIRCUIT AND METHOD FOR GENERATING MULTIPHASE CLOCK SIGNALS AND CORRESPONDING INDICATION SIGNALS

(75) Inventors: Ming-Chien Huang, Banqiao (TW); Chien-Yi Chang, Hsinchu (TW)

(73) Assignee: Elite Semiconductor Memory Technology, Inc., Hsinchu (TW)

( * ) Notice: Subject to any disclaimer, the term of this patent is extended or adjusted under 35 U.S.C. 154(b) by 8 days.

(21) Appl. No.: 13/452,118

(22) Filed: Apr. 20, 2012

(65) Prior Publication Data

US 2012/0268176 A1    Oct. 25, 2012

Related U.S. Application Data

(60) Provisional application No. 61/457,571, filed on Apr. 22, 2011.

(51) Int. Cl.
*H03K 3/00* (2006.01)

(52) U.S. Cl.
USPC ........... 327/291; 327/152; 327/163; 327/298; 327/299

(58) Field of Classification Search
USPC ......... 327/144–146, 152, 163, 291, 293–295, 327/298, 299
See application file for complete search history.

*Primary Examiner* — An Luu
(74) *Attorney, Agent, or Firm* — Stites & Harbison PLLC; Juan Carlos A. Marquez, Esq.

(57) ABSTRACT

A circuit for generating multiphase clock signals and corresponding indication signals is provided. The circuit includes a multiphase clock generation circuit, a DLL circuit, a timing circuit, and a phase comparison circuit. The multiphase clock generation circuit receives an external clock to provide a plurality of first clock signals, phases of which differ from one another. The DLL circuit receives the external clock signal to provide a second clock signal. The timing circuit receives the second clock signal and a comparison signal to provide a plurality of indication signals. Each of the plurality of indication signals has rising edges which lead the rising edges of a corresponding one of the first clock signals. The phase comparison provides the comparison signal if a delayed phase of the corresponding one of the indication signals is within a phase of one of the first clock signals.

7 Claims, 7 Drawing Sheets

CIRCUIT AND METHOD FOR GENERATING MULTIPHASE CLOCK SIGNALS AND CORRESPONDING INDICATION SIGNALS

RELATED APPLICATIONS

The present invention claims the benefit of U.S. Provisional Application Ser. No. 61/457,571 entitled "Method for synchronizing two different divided CLK system into same phase in DRAM" and filed Apr. 22, 2011.

BACKGROUND OF THE INVENTION

1. Field of the Invention

The present invention relates to a circuit and a method for generating multiphase clock signals and corresponding indication signals.

2. Description of the Related Art

Semiconductor memory devices are widely used in many electronic products and computer systems to store and retrieve data. Presently, semiconductor memory devices have become highly integrated and operate at higher speed to improve system performance. In order to enhance the operation speed of the semiconductor devices, a double data rate synchronous dynamic random access memory (DDR SDRAM) device has been developed to provide twice the operation speed of a conventional synchronous memory device. The DDR SDRAM allows data transfers on both the rising and falling edges of the system clock, and thus provides twice as much data as the conventional synchronous memory device.

As is known to one skilled in the art, the DDR SDRAM adopts a 2-bit prefetch operation to output 2-bit data to a data pad during one clock cycle. In order to prefetch more data bits, a DDR2 SDRAM and a DDR3 SDRAM have been developed. The DDR2 SDRAM adopts a 4-bit prefetch operation to output 4-bit data to a data pad during two clock cycles, and the DDR3 SDRAM adopts an 8-bit prefetch operation to output 8-bit data to a data pad during four clock cycles. As such, the data transfer rate of the DDR2 SDRAM and DDR3 SDRAM is improved by increasing the number of the prefetch bits.

In order to serially transfer parallel data to an output terminal of the memory device in an N-bit prefetch operation, a multiplexer is required during operation. FIG. 1 illustrates a conventional multiplexer 10 used in a 4-bit prefetch operation. Referring to FIG. 1, the multiplexer 10 includes a plurality of latches 102, 104, 106, and 108, and a plurality of switches 112, 114, 116, and 118.

The latches 102, 104, 106, and 108 simultaneously prefetch 4-bit data D0, D1, D2, and D3, which are transmitted from a memory cell array (not shown) via a data path, to the switches 112, 114, 116, and 118 in response to a control signal CTL. Thereafter, the switches 112, 114, 116, and 118 sequentially transfer data stored in the latches 102, 104, 106, and 108 to a node N1 in response to signals P1, P2, P3, and P4, wherein signals P1, P2, P3, and P4 are sequentially generated at a fixed interval.

FIG. 2 is an operational timing diagram illustrating operations of the conventional circuit of FIG. 1. Seventh signals are shown in FIG. 2, labeled XCLK (an external system clock signal), CTL, P1, P2, P3, P4, and DOUT (an output signal at an output terminal DQ).

The signals P1, P2, P3, and P4 are usually generated from an internal multiphase clock generation circuit (not shown). Therefore, a delay time Td occurs between rising edges of each of the multiphase signals P1, P2, P3, and P4 and rising edges of a corresponding one of the external clock signal XCLK because of internal capacitors and resistors. In FIG. 2, Td is controlled to be zero. In order to read data in synchronization with the rising edges and falling edges of the external clock signal XCLK, a corresponding indication signal is required of which timing is slightly earlier than that of the edges of the external clock signal XCLK. Therefore, there is need to develop new approaches to generate multiphase clock signals and corresponding indication signals which are suitable for use in the DDR SDRAM.

SUMMARY OF THE INVENTION

One aspect of the present invention is to provide a circuit for generating multiphase clock signals and corresponding indication signals.

According to one embodiment of the present invention, the circuit includes a multiphase clock generation circuit, a delay locked loop (DLL) circuit, a timing circuit, and a phase comparison circuit. The multiphase clock generation circuit is configured to receive an external clock signal having a first frequency. The multiphase clock generation circuit provides a plurality of first clock signals having a second frequency lower than the first frequency, phases of which differ from one another. The DLL circuit is configured to receive the external clock signal. The DLL circuit provides a second clock signal having the first frequency. The second clock signal has rising edges which lead rising edges of the external clock signal. The timing circuit is configured to receive the second clock signal and a comparison signal. The timing circuit provides a plurality of indication signals in response to the second clock signal and the comparison signal. Each of the plurality of indication signals has rising edges which lead the rising edges of a corresponding one of the first clock signals. The phase comparison circuit is configured to receive one of the first clock signals and a corresponding one of the indication signals. The phase comparison circuit provides the comparison signal if a delayed phase of the corresponding one of the indication signals is within a phase of one of the first clock signals.

Another aspect of the present invention is to provide a method for generating multiphase clock signals and corresponding indication signals.

According to another embodiment of the present invention, the method comprises receiving an external clock signal having a first frequency; providing a plurality of first clock signals in response to the external clock signal, each of the plurality of first clock signals having a second frequency lower than the first frequency, phases of which differ from one another; providing a second clock signal in response to the external clock signal, the second clock signal having the first frequency and having rising edges which lead rising edges of the external clock signal; providing a plurality of indication signals in response to a comparison signal and the second clock signal, each of the plurality of indication signals having rising edges which lead the rising edges of a corresponding one of the first clock signals; selecting one of the first clock signals and a corresponding one of the indication signals; and providing the comparison signal if a delayed phase of the selected indication signal is within a phase of the selected first clock signal.

BRIEF DESCRIPTION OF THE DRAWINGS

The invention will be described according to the appended drawings in which.

DETAILED DESCRIPTION OF THE INVENTION

Figure 1:
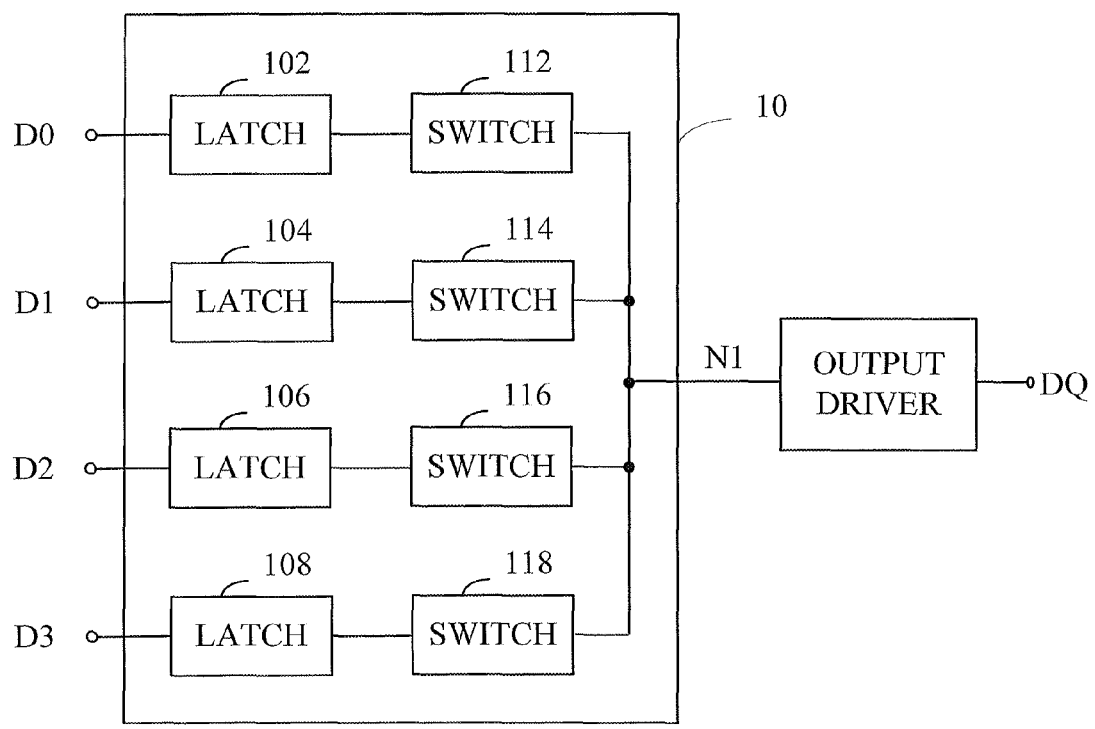
FIG. 1 illustrates a conventional multiplexer used in a 4-bit prefetch operation.
Figure 2:
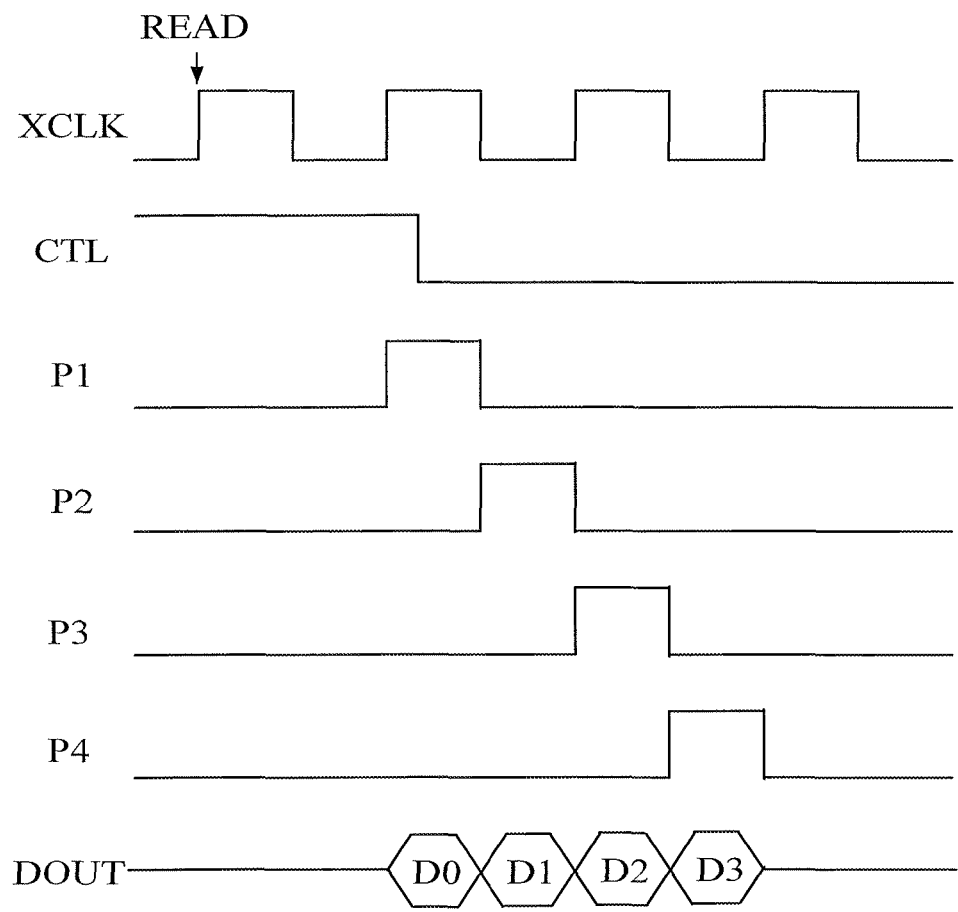
FIG. 2 is an operational timing diagram illustrating operations of the conventional circuit of FIG. 1.
Figure 3:
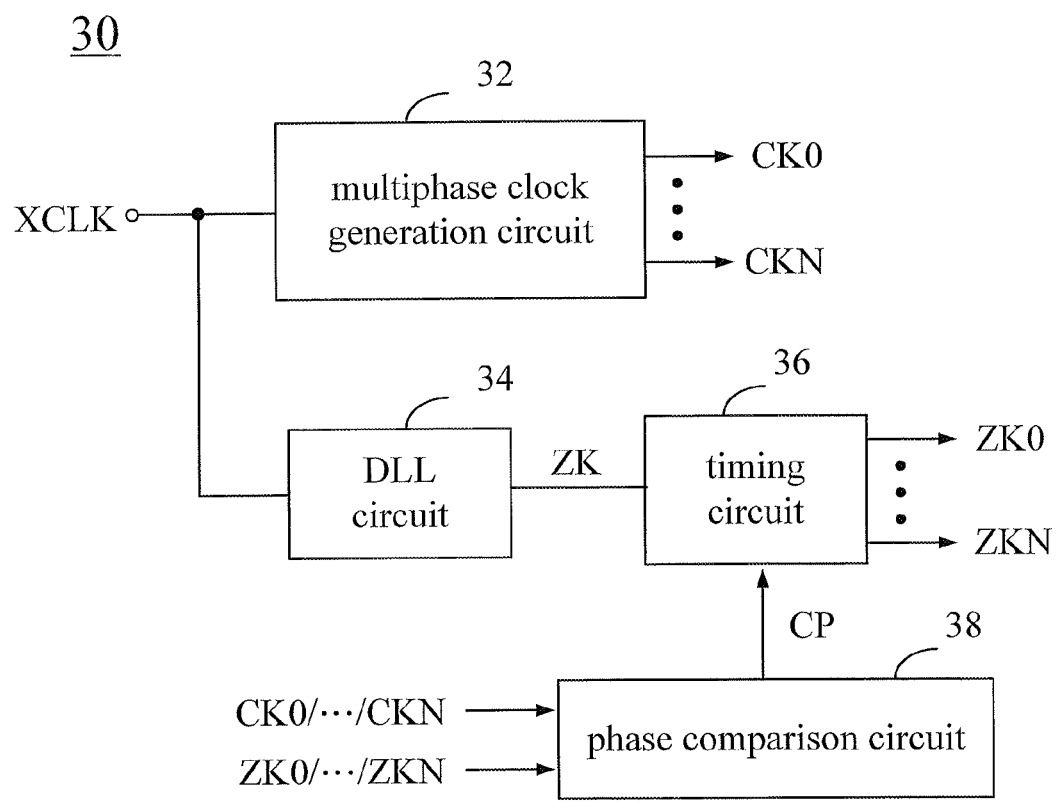
FIG. 3 is a simplified block diagram of a circuit for generating multiphase clock signals and corresponding indication signals, in accordance with an embodiment of the present invention.

FIG. 3 is a simplified block diagram of a circuit 30 for generating multiphase clock signals and corresponding indication signals, in accordance with an embodiment of the present invention. Referring to FIG. 3, the circuit 30 includes a multiphase clock generation circuit 32, a delay locked loop (DLL) circuit 34, a timing circuit 36, and a phase comparison circuit 38. The multiphase clock generation circuit 32 receives an external clock signal XCLK to generate a plurality of internal clock signals CK0-CKN, the phases of which differ from one another. The DLL circuit 34 receives the external clock signal XCLK to generate a clock signal ZK. The clock signal ZK has the same frequency as the external clock signal XCLK. However, rising edges of the clock signal ZK are timed to lead rising edges of the external clock signal XCLK.

The timing circuit 36 receives the clock signal ZK and a comparison signal CP to generate a plurality of indication signals ZK0-ZKN in response to the clock signal and the comparison signal CP. Each of the plurality of the indication signals ZK0-ZKN has rising edges which lead the rising edges of a corresponding one of the internal clock signals CK0-CKN. For example, the indication signal ZK0 of the timing circuit 36 corresponds to the clock signal CK0 of the multiphase clock generation circuit 32, and the indication signal ZKN of the timing circuit 36 corresponds to the clock signal CKN of the multiphase clock generation circuit 32. Therefore, the rising edges of the indication signal ZK0 lead the rising edges of the clock signal CK0, and the rising edges of the indication signal ZKN lead the rising edges of the clock signal CKN.

The phase comparison circuit 38 receives one of the clock signals CK0-CKN and a corresponding one of the indication signals ZK0-ZKN to generate the comparison signal CP based on a comparison result. In this embodiment, the phase comparison circuit 38 compares the clock signal CK0 with the corresponding indication signal ZK0. If a phase of a delayed indication signal ZKD is within a phase of the clock signal CK0, the comparison signal CP goes to low (logic "0") and other indication signals ZK1-ZKN of the timing circuit 36 are asserted accordingly.

Figure 4:
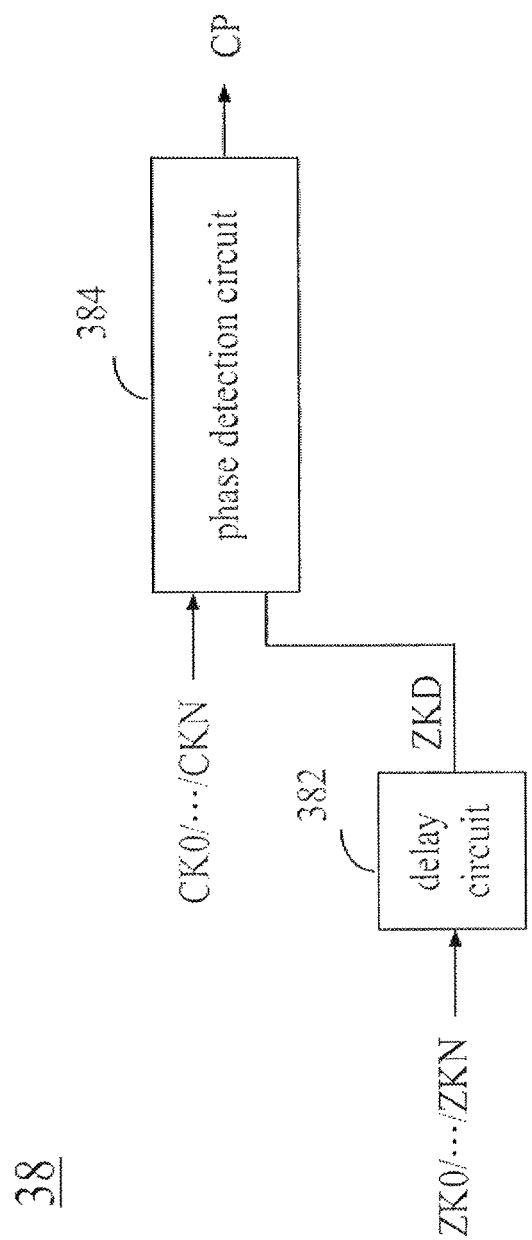
FIG. 4 is a schematic circuit diagram of the phase comparison circuit shown in FIG. 3, in accordance with an embodiment of the present invention.

FIG. 4 is a schematic circuit diagram of the phase comparison circuit 38 shown in FIG. 3, in accordance with an embodiment of the present invention. Referring to FIG. 4, the phase comparison circuit 38 includes a delay circuit 382 and a phase detection circuit 384. The delay circuit 382 delays the selected indication signal for a predetermined time to output a delayed indication signal ZKD. The phase detection circuit 384 detects a phase of the delayed indication signal ZKD of the delay circuit 382 with that of the corresponding clock signal of the multiphase clock generation circuit 32 to thereby control the operation of the timing circuit 36.

Figure 5:
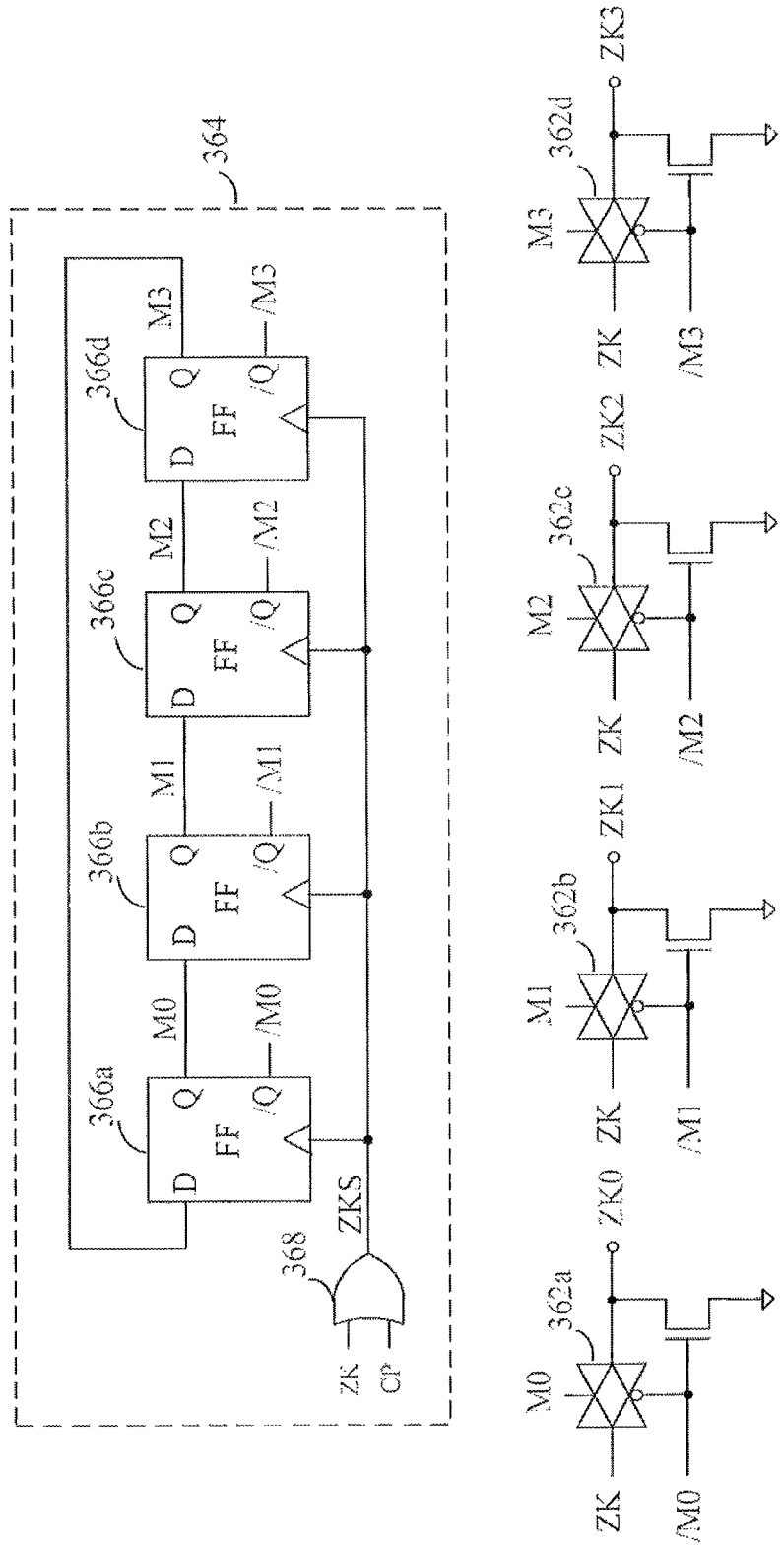
FIG. 5 is a schematic circuit diagram of the timing circuit shown in FIG. 3, in accordance with an embodiment of the present invention.

FIG. 5 is a schematic circuit diagram of the timing circuit 36 shown in FIG. 3, in accordance with an embodiment of the present invention. For the purpose of concision, a four-stage serial counting circuit is exemplified. However, the present invention is not limited to this embodiment. Referring to FIG. 5, the timing circuit 36 includes a plurality of switches 362a, 362b, 362c, and 362d and a counting circuit 364. Each of the switches 362a, 362b, 362c, and 362d passes parts of the clock signal ZK in response to the comparison signal CP and the clock signal ZK. The counting circuit 364 receives the clock signal ZK and the comparison signal CP to generate a series of switch signals MO-MN each of which sequentially enables one switch at a time from the respectively coupled switches relative to the clock signal ZK when the comparison signal CP goes to low (logic "0").

Figure 6:
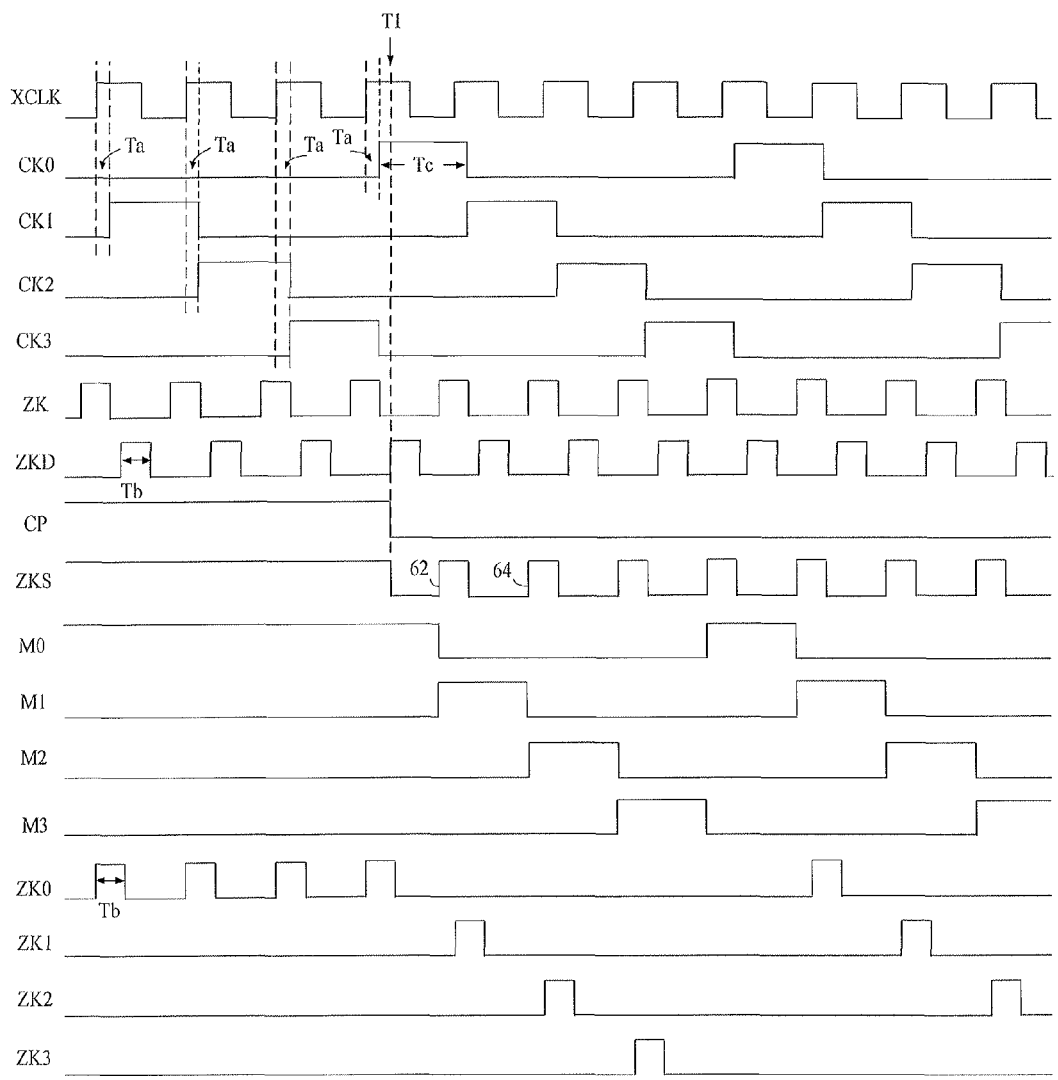
FIG. 6 is a timing diagram illustrating one operation of the circuit of FIG. 3.

FIG. 6 is a timing diagram illustrating an operation of the circuit 30 of FIG. 3. In this case, the multiphase clock generation circuit 32 receives the external clock signal XCLK to generate four internal clock signals CK0, CK1, CK2, and CK3. The following description refers to FIG. 3-FIG. 6.

The multiphase clock generation circuit 32 divides the frequency of the input signal XCLK to generate the internal clock signals CK0, CK1, CK2, and CK3 having the frequency which is one fourth of the frequency of the input signal. Therefore, the frequency of each of the clock signals CK0, CK1, CK2, and CK3 is ¼times the frequency of the input signal XCLK. Referring to FIG. 6, phases of the signals CK0, CK1, CK2, and CK3 differ from one another. In addition, a delay time Ta occurs between rising edges of each of the signals CK0, CK1, CK2, and CK3 and rising edges of a corresponding one of the clock signal XCLK because of the internal capacitor and resistor.

The DLL circuit 34 receives the external clock signal XCLK to generate the clock signal ZK. The clock signal ZK has the same frequency as the external clock signal XCLK. However, rising edges of the clock signal ZK are timed to lead rising edges of the external clock signal XCLK as shown in FIG. 6.

In this embodiment, the phase comparison circuit 38 compares a phase of the clock signal CK0 with a phase of the corresponding indication signal ZK0. Because the rising edges of the signal ZK0 lead the rising edges of the signal CK0, the delay circuit 382 is designed to delay the signal ZK0 for a predetermined time so as to generate the delayed indication signal ZKD. Thereafter, the phase detection circuit 384 detects if a phase Tb of the delayed indication signal ZKD is within a phase Tc of the clock signal CK0 and provides the comparison signal CP based on the detection.

Referring to FIG. 6, before time T1, the comparison signal CP is high (logic "1") because the phase Tb of the delayed indication signal ZKD is not within the phase Tc of the clock signal CK0. At time T1, the phase Tb of the delayed indication signal ZKD is within the phase Tc of the clock signal CK0, causing the comparison signal CP to go low (logic "0"). The phase detection circuit 384 continues to detect if the phase Tb of the delayed indication signal ZKD is within the phase Tc of the clock signal CK0 and generates the comparison signal CP based on the detection.

The timing circuit 36 receives the clock signal ZK and the comparison signal CP to generate the indication signals ZK0, ZK1, ZK2, and ZK3. The detailed operation of the timing circuit 36 including the switches 362a, 362b, 362c, and 362d and the counting circuit 364 is described below. Referring to both FIG. 5 and FIG. 6, each of the switches 362a, 362b, 362c, and 362d is correspondingly coupled to one of a set of flip-flops 366a, 366b, 366c, and 366d in the counting circuit 364. The inputs and outputs of the flip-flops 366a, 366b, 366c, and 366d are coupled together in series with the output of the last flip-flop 366d being coupled to the input of the first flip-flop 366a. In addition, each of the outputs of the flip-flops 366a, 366b, 366c, and 366d is coupled to a corresponding switch. For example, the output of the flip-flop 366a is coupled to the switch 362a, the output of the flip-flop 366b is coupled to the switch 362b, and so on.

In this embodiment of the present invention, the phase comparison circuit 38 compares the phase Tc of the clock signal CK0 with the phase Tb of the corresponding indication signal ZK0. Therefore, the output of each of the flip-flops 366a, 366b, 366c, and 366d is initially reset to low before operation, except the first flip-flop 366a, which is initially reset to high. Accordingly, the switch 362a turns on and the switches 362b, 362c, and 362d turn off in the beginning so that the switch 362a passes the clock signal ZK to its output terminal to form the indication signal ZK0. When the comparison signal CP goes to low, a clock signal ZKS from an OR gate 368 goes to low. Since the flip-flops 366a, 366b, 366c, and 366d are all clocked by the clock signal ZKS from the OR gate 368, the flip-flop 366a provides its high input to the flip-flop 366b at the rising edge 62 of the clock signal ZKS. Meanwhile, the switch 362b turns on and other switches 362a, 362c, and 362d turn off so that the switch 362b passes the clock signal ZK to its output terminal to form the indication signal ZK1.

Thereafter, at the rising edge 64 of the clock signal ZKS, the flip-flop 366b provides its high input to the flip-flop 366c, which then turns on the switch 362c to passes the clock signal ZK to its output terminal to form the indication signal ZK2. In this manner only one of the switches 362a, 362b, 362c, and 362d turns on at one time to pass the clock signal ZK to its output terminal. Therefore, the switches 362a, 362b, 362c, and 362d sequentially pass parts of the clock signal ZK to its output terminal, and thus forms the indication signals ZK0-ZK3.

Figure 7:
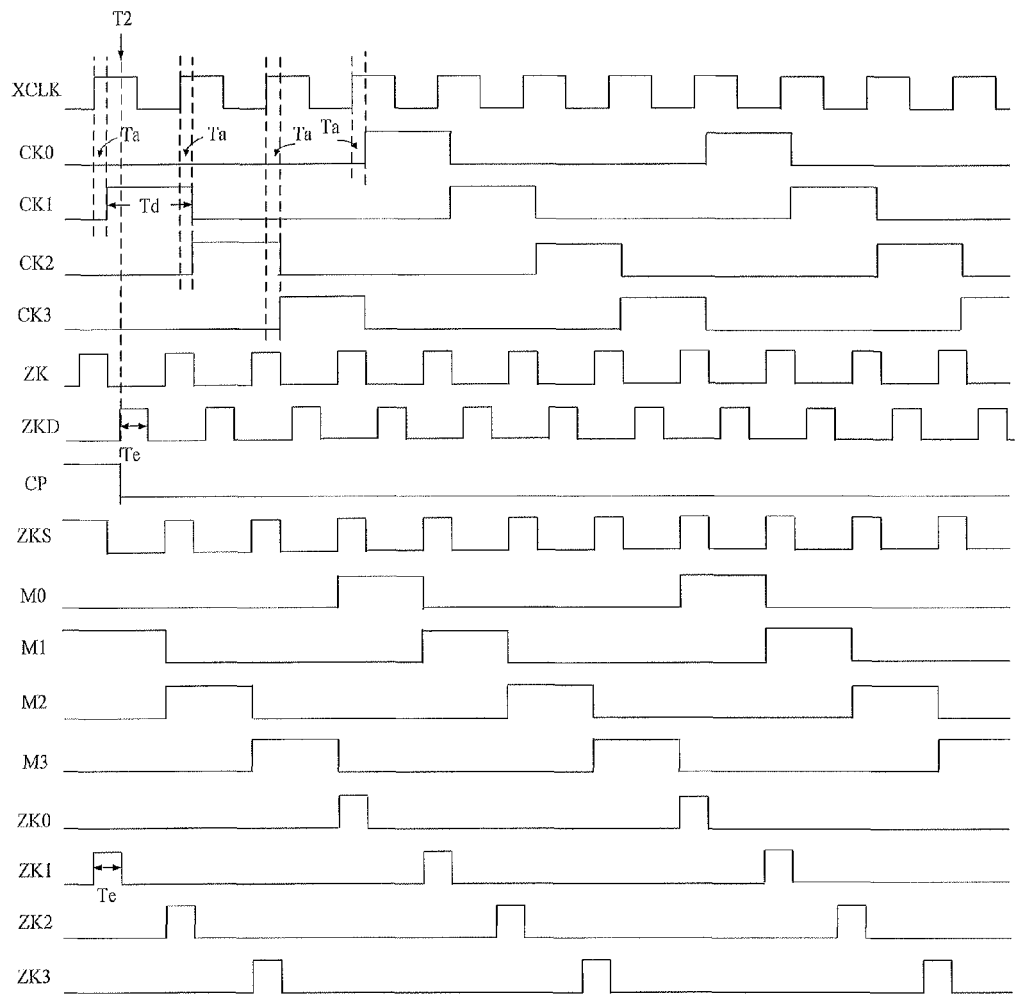
FIG. 7 is a timing diagram illustrating another operation of the circuit of FIG. 3.

In another embodiment of the present invention, the phase comparison circuit 38 may compare a phase Td of the clock signal CK1 with a phase Te of the corresponding indication signal ZK1, as shown in FIG. 7. Therefore, the output of each of the flip-flops 366a, 366b, 366c, and 366d is initially reset to low before operation, except the second flip-flop 366b, which is initially reset to high. Accordingly, the switch 362b turns on and the switches 362a, 362c, and 362d turn off in the beginning so that the switch 362b passes the clock signal ZK to its output terminal to form the indication signal ZK1.

Referring to FIG. 7, before time T2, the comparison signal CP is high (logic "1") because the phase Te of the delayed indication signal ZKD is not within the phase Td of the clock signal CK1. At time T1, the phase Te of the delayed indication signal ZKD is within the phase Td of the clock signal CK1, causing the comparison signal CP to go low (logic "0"). When the comparison signal CP goes to low, the counting circuit 364 provides a series of switch signals M0-M3. Each of the switch signals M0-M3 sequentially enables one switch at a time from the respectively coupled switches relative to the clock signal ZK, as shown in FIG. 7. In this manner only one of the switches 362a, 362b, 362c, and 362d turns on at one time to pass the clock signal ZK to its output terminal. Therefore, the switches 362b, 362c, 362d, and 362a sequentially pass parts of the clock signal ZK to its output terminal, and thus form the corresponding indication signals ZK1, ZK2, ZK3, and ZK0.

Thus, in accordance with the above embodiments of the present invention, the circuit 30 can generate multiphase clock signals and corresponding indication signals whose rising edges are timed to lead the rising edges of a corresponding one of the multiphase clock signals.

The above-described embodiments of the present invention are intended to be illustrative only. Numerous alternative embodiments may be devised by those skilled in the art without departing from the scope of the following claims.

What is claimed is:

1. A circuit for generating multiphase clock signals and corresponding indication signals, comprising:
    a multiphase clock generation circuit configured to receive an external clock signal having a first frequency, the multiphase clock generation circuit providing a plurality of first clock signals having a second frequency lower than the first frequency, phases of which differ from one another;
    a delay locked loop (DLL) circuit configured to receive the external clock signal, the DLL circuit providing a second clock signal having the first frequency, the second clock signal having rising edges which lead rising edges of the external clock signal;
    a timing circuit configured to receive the second clock signal and a comparison signal, the timing circuit providing a plurality of indication signals in response to the second clock signal and the comparison signal, each of the plurality of indication signals having rising edges which lead the rising edges of a corresponding one of the first clock signals; and
    a phase comparison circuit configured to receive one of the first clock signals and a corresponding one of the indication signals, the phase comparison circuit providing the comparison signal if a delayed phase of the corresponding one of the indication signals is within a phase of one of the first clock signals.

2. The circuit of claim 1, wherein the phase comparison circuit comprises:
    a delay circuit configured to delay the corresponding one of the indication signals for a predetermined time to provide the delayed phase of the corresponding one of the indication signals; and
    a phase detection circuit configured to detect the delayed phase of the corresponding one of the indication signals and the phase of one of the first clock signals to provide the comparison signal.

3. The circuit of claim 1, wherein the timing circuit comprises a plurality of switches, each of the switches passing parts of the second clock signal to form one of the indication signals in response to the comparison signal and the second clock signal.

4. The circuit of claim 3, wherein the timing control circuit comprises a counting circuit configured to receive the second clock signal and the comparison signal, the counting circuit providing a series of switch signals each of which sequentially enables one switch at a time from the respectively coupled switches relative to the second clock signal when the comparison signal is provided.

5. A method for generating multiphase clock signals and corresponding signals, comprising:
    receiving an external clock signal having a first frequency;
    providing a plurality of first clock signals in response to the external clock signal, each of the plurality of first clock signals having a second frequency lower than the first frequency, phases of which differ from one another;

providing a second clock signal in response to the external clock signal, the second clock signal having the first frequency and having rising edges which lead rising edges of the external clock signal;

providing a plurality of indication signals in response to a comparison signal and the second clock signal, each of the plurality of indication signals having rising edges which lead the rising edges of a corresponding one of the first clock signals;

selecting one of the first clock signals and a corresponding one of the indication signals; and providing the comparison signal if a delayed phase of the selected indication signal is within a phase of the selected first clock signal.

6. The method of claim 5, wherein providing the comparison signal if the delayed phase of the selected indication signal is within the phase of the selected clock signal comprises:

delaying the selected indication signal for a predetermined time to provide the delayed phase of the selected indication signal; and detecting the delayed phase of the selected indication signal and the phase of the selected first clock signals to provide the comparison signal.

7. The method of claim 5, wherein providing the plurality of indication signals in response to the comparison signal and the second clock signal comprises sequentially passing parts of the second clock signal to one of the indication signals in response to the comparison signal and the second clock signal.

* * * * *